(12) United States Patent
Oguri

(10) Patent No.: US 6,236,255 B1
(45) Date of Patent: May 22, 2001

(54) OUTPUT IMPEDANCE ADJUSTMENT CIRCUIT

(75) Inventor: Takashi Oguri, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/200,476

(22) Filed: Nov. 27, 1998

(30) Foreign Application Priority Data

Nov. 27, 1997 (JP) .................................................... 9-325515

(51) Int. Cl.⁷ .................................. H03B 1/00; H03K 5/08
(52) U.S. Cl. ........................................ 327/310; 327/108
(58) Field of Search ................................. 327/108, 109, 327/112, 310, 379, 391, 399, 404, 427, 434, 437; 326/80–87, 30

(56) References Cited

U.S. PATENT DOCUMENTS

| | | | |
|---|---|---|---|
| 4,006,423 | * 2/1977 | Kuniyoshi et al. | 327/3 |
| 4,742,247 | * 5/1988 | Venkatesh | 327/51 |
| 5,315,186 | * 5/1994 | Baker | 327/3 |
| 5,929,668 | * 7/1999 | Kim | 327/112 |
| 5,955,893 | * 9/1999 | Chang et al. | 326/71 |

FOREIGN PATENT DOCUMENTS

H8-195669    7/1996 (JP) .

* cited by examiner

*Primary Examiner*—My-Trang Nu Ton
(74) *Attorney, Agent, or Firm*—Sughrue, Mion, Zinn, Macpeak & Seas, PLLC

(57) ABSTRACT

An output circuit has an n-channel constant voltage circuit and p-channel constant voltage circuit. The output circuit includes a p-channel MOS transistor and an n-channel MOS transistor at the output stage thereof. The n-channel constant voltage circuit controls the drive of the p-channel MOS transistor, and causes current flowing through the p-channel MOS transistor so that current path through the p-channel MOS transistor to be constant or substantially constant. The p-channel constant voltage circuit controls the drive of the n-channel MOS transistor, and causes current flowing through the n-channel MOS transistor so that current path through the n-channel MOS transistor to be constant or substantially constant.

13 Claims, 5 Drawing Sheets

OUTPUT IMPEDANCE ADJUSTMENT CIRCUIT

BACKGROUND OF THE INVENTION

The present invention relates to an output circuit, and more particularly, to a high-speed output circuit for matching impedance.

Referring to FIG. 7, a conventional output circuit of this type includes a PMOS transistor 106 and an NMOS transistor 206. The output circuit is connected to a transmission line. In general, it is important to match impedance between the transmission line and a load (the output circuit). MOS transistors 106 and 206 have resistor components, however, since it is difficult to match the impedance by using only the resistor component of the MOS transistor itself, a resistor is built in the LSI or added to the exterior of the LSI to match the impedance. Thus, the output circuit is provided with a termination resistor 308 for matching the impedance between the transmission line and the output circuit. The output circuit inputs an input signal from an input terminal 508 and outputs an output signal to a output terminal 506 via resistor 308.

However, in this embodiment, since the resistance value of the MOS transistors is influenced by variations in temperature or power voltage or a manufacturing process, rather than that by the resistor 308, it is necessary to increase the resistance of resistor 308. At the same time, the resistance component of the MOS transistors should be decreased. As a result, the gate widths of the MOS transistors 106 and 206 are increased. Thus, a problem arises because the size of the MOS transistor increases. In general, since a LSI has a plurality of output circuits, the size of the LSI also increases. Furthermore, as the size of the MOS transistor increases, another problem is produced because noise and power consumption increases due to an increase of the through-current of MOS transistors 106 and 206.

SUMMARY OF THE INVENTION

Accordingly, an object of the present invention is to provide a high-speed output circuit.

Another object of the present invention is to provide a small output circuit.

Another object of the present invention is to provide an output circuit which reduces noises and power.

According to one aspect of the present invention, there is provided: an output circuit which comprises an output terminal; a first circuit having a first input terminal, to which a first input signal is input, connected to a first power supply source, wherein the first circuit forms a first current path between the first power supply source and the output terminal in accordance with the first input signal; a second circuit having a second input terminal, to which a second input signal is input, connected to a second power supply source, wherein the second circuit forms a second current path between the second power supply source and the output terminal in accordance with the second input signal; a third circuit which provides the first input signal to the first input terminal and makes current flowing on the first current path constant or substantially constant; and a fourth circuit which provides the second input signal to the second input terminal and makes current flowing on the second current path constant or substantially constant.

According to another aspect of the present invention, there is provided an output circuit which comprises a buffer circuit connected to a power supply source and a output terminal, wherein the buffer circuit forms a current path between the power supply source and the output terminal, and a control circuit which makes current flowing on the current path constant or substantially constant.

BRIEF DESCRIPTION OF THE DRAWINGS

Other features and advantages of the invention are made more apparent in the detailed keep been taken in conjunction with the accompanying drawings, wherein.

In the drawings, the same reference numerals represent the same structural elements.

DETAILED DESCRIPTION OF THE PREFERRED EMBODIMENTS

The first embodiment of the present invention will be described in detail below.

Figure 1:
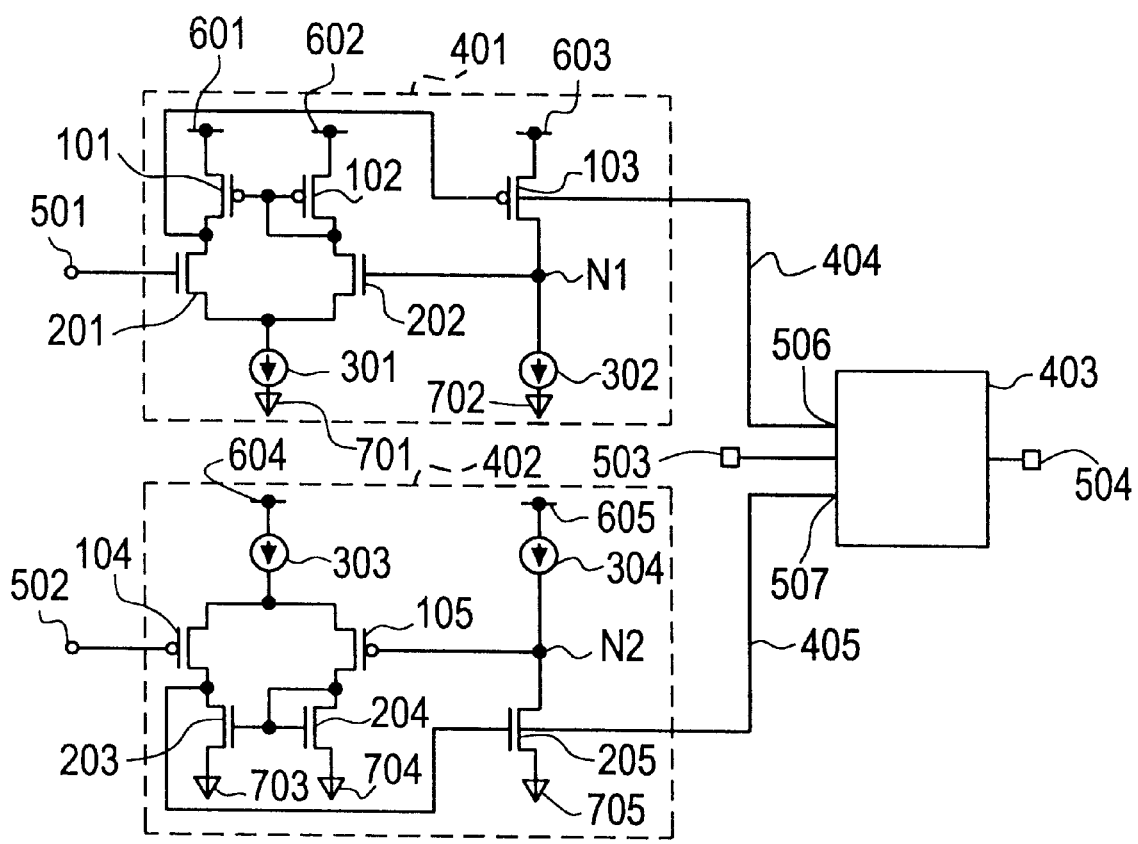
FIG. 1 is a circuit diagram of an output circuit of the present invention.

Referring to FIG. 1, an output circuit includes an n-channel constant voltage circuit 401 and a p-channel constant voltage circuit 402. N-channel constant voltage circuit 401 and p-channel constant voltage circuit 402 are connected to an output buffer circuit 403.

N-channel constant voltage circuit 401 includes PMOS transistors 101, 102 and 103, NMOS transistors 201 and 202, and current sources 301 and 302. PMOS transistor 101 has a source terminal connected to a power supply source 601, a gate terminal connected to the gate and drain terminals of PMOS transistor 102 and, a drain terminal connected to a gate terminal of PMOS transistor 103 and a drain terminal of NMOS transistor 201.

PMOS transistor 102 has a source connected to a power supply source 602, a gate terminal connected to a gate terminal of PMOS transistor 101, and a drain terminal connected to a gate of PMOS transistor 101, a gate of PMOS transistor 102 and a drain terminal of NMOS transistor 202.

NMOS transistor 201 has a drain terminal connected to the drain of PMOS transistor 101, a gate terminal connected to a input terminal 501, and a source terminal connected to current source 301.

NMOS transistor 202 has a drain terminal connected to the drain terminal of PMOS transistor 102, a gate terminal connected to a terminal N1 and a source terminal connected to the current source 301 and the source terminal of NMOS transistor 201.

A reference potential is applied to input terminal 501. In this embodiment, the reference potential is 1.25 volt.

Current source 301 has one terminal connected to a power supply source 701, and the other terminal connected to the source terminal of NMOS transistor 201 and the source terminal of NMOS transistor 202.

PMOS transistor 103 has a gate terminal connected to the drain terminal of PMOS transistor 101, the drain terminal of NMOS transistor 201 and a contact 404, a source terminal connected to a power supply source 603, and a drain terminal connected to the node N1. Contact 404 is a point at which the drain terminal of PMOS transistor 101, the drain terminal of NMOS transistor 201 and the gate terminal of PMOS transistor 103 are in contact with each other.

Current source 302 has one terminal connected to a power supply source 702 and the other terminal connected to the node N1. In this embodiment, power supply sources 601, 602 and 603 are 2.5 volts, and power supply sources 701 and 702 are 0 volt, that is, ground.

P-channel constant voltage circuit 402 includes PMOS transistors 104 and 105, NMOS transistors 203, 204 and 205, and current sources 303 and 304. NMOS transistor 203 has a source terminal connected to a power supply source 703, a gate terminal connected to gate and drain terminals of NMOS transistor 204, and a drain terminal connected to a gate terminal of NMOS transistor 205 and a drain terminal of PMOS transistor 104.

NMOS 204 has a source connected to a power supply source 704, a gate terminal connected to the gate terminal of NMOS transistor 203 and a drain terminal connected to a gate of NMOS transistor 203, a gate of NMOS transistor 204 and a drain terminal of PMOS transistor 105.

PMOS transistor 104 has the drain terminal connected to the drain of NMOS transistor 203, a gate terminal connected to a input terminal 502, and a source terminal connected to current source 303.

PMOS transistor 105 has a drain terminal connected to the drain terminal of NMOS transistor 204, a gate terminal connected to a terminal N2, and a source terminal connected to the current source 303 and the source terminal of PMOS transistor 104.

A reference potential is applied to input terminal 502. In this embodiment, the reference potential is 1.25 volt.

Current source 303 has one terminal connected to a power supply source 604, and the other terminal connected to the source terminal of PMOS transistor 104 and the source terminal of PMOS transistor 105.

NMOS transistor 205 has a gate terminal connected to the drain terminal of NMOS transistor 203, the drain terminal of PMOS transistor 104 and a contact 405, a source terminal connected to a power supply source 705, and a drain terminal connected to the node N2. Contact 405 is a point at which the drain terminal of NMOS transistor 203, the drain terminal of PMOS transistor 104 and the gate terminal of NMOS transistor 205 are in contact with each other.

Current source 304 has one terminal connected to a power supply source 605 and the other terminal connected to the node N2. In this embodiment, power supply sources 604 and 605 are 2.5 volts, and power supply sources 703, 704 and 705 are 0 volt, that is, ground.

Output buffer circuit 403 has a input terminal 503, an output terminal 504, and a control terminals 506 and 507. Control terminal 506 is connected to contact 404 of n-channel constant voltage circuit 401. Control terminal 507 is connected to contact 405 of p-channel constant voltage circuit 402.

Figure 2:
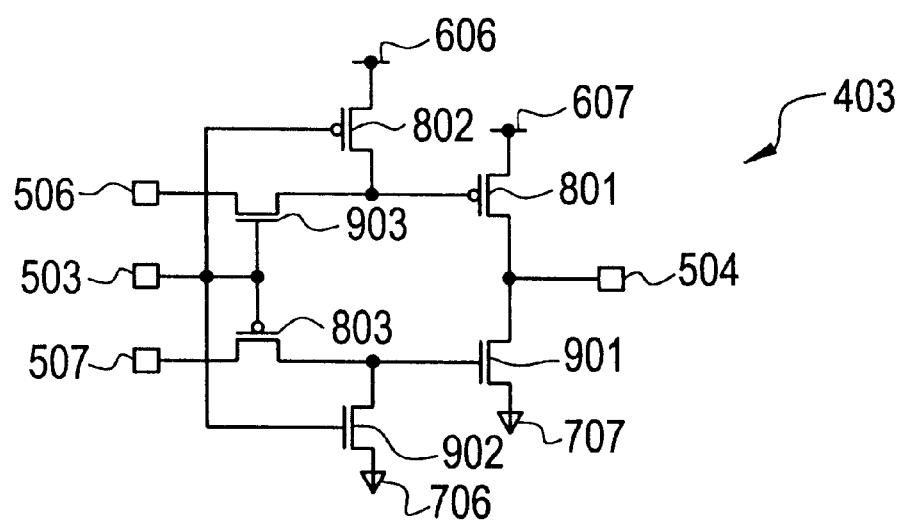
FIG. 2 is a circuit diagram of an output buffer circuit of the first embodiment of the present invention.
Figure 3A:
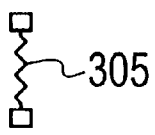
FIGS. 3A to 3C are diagrams of current sources.
Figure 3B:
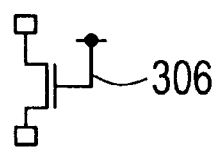
Figure 3C:
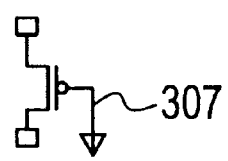

Referring to FIG. 2, output buffer circuit 403 includes PMOS transistors 801, 802 and 803, and NMOS transistors 901, 902 and 903. PMOS transistor 801 has a source terminal connected to a power supply source 607, a drain terminal connected to a output terminal 504 and a drain terminal of NMOS transistor 901, and gate terminal connected to a drain terminal of PMOS transistor 802 and a drain terminal of NMOS transistor 903.

PMOS transistor 802 has a source terminal connected to a power supply source 606, a drain terminal connected to the gate terminal of PMOS transistor 801 and the drain terminal of NMOS transistor 903, and a gate terminal connected to and input terminal 503, a gate terminal of NMOS transistor 903 and a gate terminal of PMOS transistor 803.

NMOS 901 has a source terminal connected to a power supply source 707, a drain terminal connected to output terminal 504 and the drain terminal of PMOS transistor 801, and a gate terminal connected to a drain terminal of NMOS transistor 902 and a drain terminal of PMOS transistor 803.

NMOS transistor 902 has a source terminal connected to a power supply source 706, a drain terminal connected to the gate terminal of NMOS transistor 901 and the drain terminal of PMOS transistor 803, and a gate terminal connected to input terminal 503, the gate terminal of PMOS transistor 803 and the gate terminal of NMOS transistor 903.

PMOS transistor 803 has a source terminal connected to control terminal 507, the drain terminal connected to the drain terminal of NMOS transistor 902 and the gate terminal of NMOS transistor 901, and the gate terminal connected to input terminal 503.

NMOS transistor 903 has a source terminal connected to control terminal 506, the drain terminal connected to the drain terminal of PMOS transistor 802 and the gate terminal of PMOS transistor 801, and a gate terminal connected to input terminal 503.

In FIGS. 1 and 2, n-channel constant voltage circuit 401 controls the drive capacity of PMOS transistor 801 in the output buffer circuit 403. Specifically, since a control signal, which controls PMOS transistor 103 to cause a constant or substantially constant current flow, is input to PMOS transistor 801. PMOS transistor 801 makes the current flowing from the power supply source 607 to output terminal 504 constant or substantially constant. P-channel constant voltage circuit 402 also controls the drive capacity of NMOS transistor 901 in the output buffer circuit 403. Specifically, since a control signal, which controls NMOS transistor 205 to cause a constant or substantially constant current flow, is input to NMOS transistor 901, NMOS transistor 901 makes the current flowing from output terminal 504 to power supply source 707 constant or substantially constant.

Referring to FIGS. 1 and 3A to 3C, current sources 301, 302, 303 and 304 comprise a resistor 305, an NMOS transistor 306 or a PMOS transistor 307. While resistor 305 may be affected by the potential variation of the power supply source, it is preferable to use it as current source as long as a range for impedance adjustment is allowed to vary. On the other hand, if NMOS transistor 602 or PMOS transistor 603 are used as current sources 301, 302, 303 or 304, the manufacturing process is simplified.

Next, the operation of this embodiment is described be ow.

Figure 4:
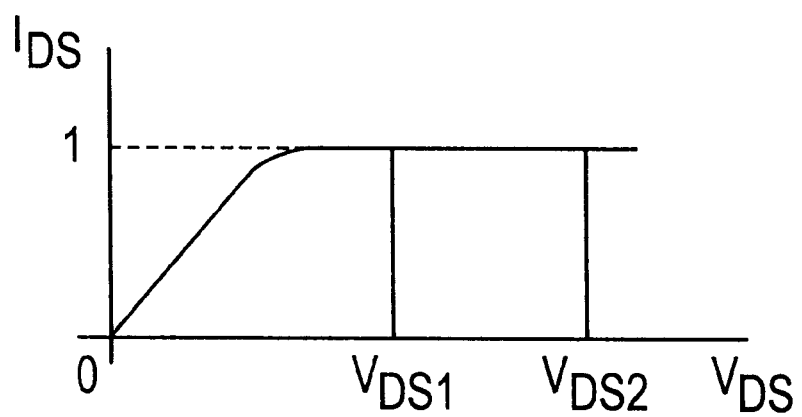
FIG. 4 is a diagram showing a current characteristic of a MOS transistor.

Referring to FIGS. 1, 2 and 3, n-channel constant voltage circuit 401 compares reference potential 501 with the potential of node N1, and feeds back the result of the comparison to the gate of PMOS transistor 103. Therefore, the drain of PMOS transistor 103, that is, node N1, is adjusted to become a predetermined constant potential. More specifically, the potential of node N1 is controlled so that it is equal to reference potential 501. If a resistor 305 is used as the current source 302, it is preferable that PMOS transistor 103 causes a constant current to flow through node N1 and causes the potential of the node N1 to be constant. In the case where the power supply is varied, the gate of PMOS transistor 103 follows its variation. According to the characteristic of the MOS transistor as shown in FIG. 4, even if the potential between power supply source 603 and node N1 changes, for example, $V_{DS1}$ or $V_{DS2}$, a current $l_{DS}$ flowing between the drain terminal and the source terminal of PMOS transistor 103 is a constant or substantially constant value I. The gate potential of the PMOS transistor 103 is input to the gate of PMOS transistor 801 via contact 404 and control terminal 506.

P-channel constant voltage circuit 402 compares reference potential 502 with the potential of node N2, and feeds back the result of the comparison to the gate of NMOS transistor 205. In this way, the drain of NMOS transistor 205, that is, node N2, is adjusted to become a predetermined constant potential. More specifically, the potential of node N2 is controlled so that it is equal to reference potential 502. If a resister 305 is used as the current source 304, it is preferable that NMOS transistor 205 causes a constant current to flow through node N2 and causes the potential of the node N2 to be constant. In the case where the power supply is varied, the gate of NMOS transistor 205 follows its variation. The gate potential of the NMOS transistor 205 is input to the gate of NMOS transistor 901 via contact 405 and control terminal 507.

The gate potential of the PMOS transistor 103 input from control terminal 506 is supplied to the gate of PMOS transistor 801 through NMOS transistor 903 and PMOS transistor 802. NMOS transistor 903 and PMOS transistor 802 are controlled according to a variation of the low/high level of the input signal 503. More specifically, when the input signal from input terminal 503 is high, NMOS transistor 903 turns on and PMOS transistor 802 turns off. Accordingly, the signal on the control terminal 506 is supplied to the gate of PMOS transistor 801 at the output stage of output buffer circuit 403. Therefore, when the input signal 503 is high, the signal 506 is supplied to the PMOS 801 to adjust output impedance. On the other hand, when the input signal on input terminal 503 is low, the NMOS transistor 903 turns off and PMOS transistor 802 turns on. The potential of the power supply source 606 is applied to the gate of PMOS transistor 801 through PMOS transistor 802. Accordingly, PMOS transistor 801 turns off.

The gate potential of the NMOS transistor 205 input from control terminal 507 is supplied to the gate of NMOS transistor 901 through PMOS transistor 803 and the NMOS transistor 902. PMOS transistor 803 and NMOS transistor 902 are controlled according to a variation of the low/high level of the input signal 503. More specifically, when the input signal input from input terminal 503 is high, PMOS transistor 803 turns on and NMOS transistor 902 turns off. Accordingly, the signal on the control terminal 507 is supplied to the gate of NMOS transistor 901 at the output stage of output buffer circuit 403. In this way, when the input signal 503 is high, the signal 507 is supplied to the NMOS 901 to adjust output impedance. On the other hand, when the input signal on input terminal 503 is low, the PMOS transistor 803 turns off and NMOS transistor 902 turns on. The potential of power supply source 706 is applied to the gate of NMOS transistor 901 through NMOS transistor 902. Accordingly, NMOS transistor 901 turns off.

Next, a second embodiment of the present invention will be described in detail below. One feature of the second embodiment lies in the components of the output buffer circuit.

Figure 5:
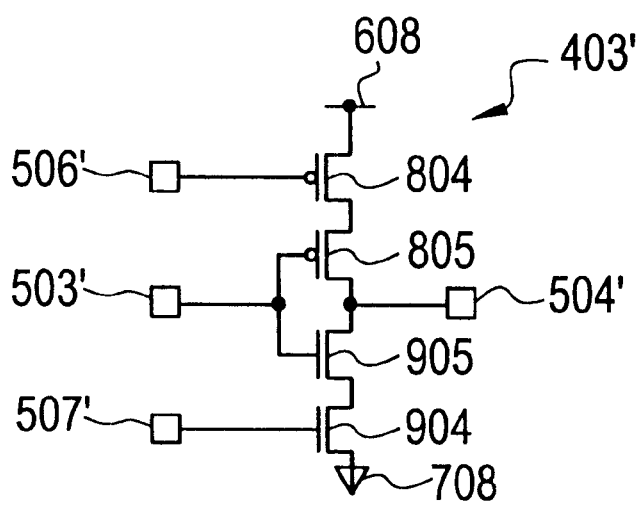
FIG. 5 is a circuit diagram of the output buffer circuit of the second embodiment of the present invention.

Referring to FIG. 5, a output buffer circuit 403' includes PMOS transistors 804 and 805, and NMOS transistors 904 and 905. Output buffer circuit 403' has an input terminal 503', an output terminal 504', and control terminals 506' and 507'.

PMOS transistor 804 has a source terminal connected to a power supply source 608, a drain terminal connected to PMOS transistor 805, and a gate terminal connected to control terminal 506'.

PMOS transistor 805 has a source terminal connected to the drain terminal of PMOS transistor 804, a drain terminal connected to output terminal 504', and a gate terminal connected to input terminal 503'.

NMOS transistor 904 has a source terminal connected to the power supply source 708, a drain terminal connected to NMOS transistor 905, and a gate terminal connected to control terminal 507'.

NMOS transistor 905 has a source terminal connected to the drain terminal of NMOS transistor 904, a drain terminal connected to output terminal 504' and the drain terminal of PMOS transistor 805, and a gate terminal connected to input terminal 503' and the gate terminal of PMOS transistor 805.

Next, the operation of the embodiment will be described below.

Referring to FIGS. 1 and 5, the gate potential of PMOS transistor 103 is applied to the gate terminal of PMOS transistor 804 via contact 404 and control terminal 506'. The gate potential of NMOS transistor 205 is applied to the gate terminal of NMOS transistor 901 via contact 405 and control terminal 506'. PMOS transistor 804 and NMOS transistor 904 are connected to output terminal 504' through PMOS transistor 805 and NMOS transistor 905, respectively. PMOS transistor 805 and NMOS transistor 905 turn on or off according to the low/high level of the input signal input from input terminal 503'. When PMOS transistor 805 turns on, a current path is formed between output terminal 504' and the drain terminal of PMOS transistor 804. Accordingly, constant or substantially constant current flows between output terminal 504' and power supply source 608 in accordance with the gate potential of PMOS 103 from control terminal 506'. On the other hand, when NMOS transistor 905 turns on, a current path is formed between output terminal 504' and the drain terminal of NMOS transistor 904. Accordingly, constant or substantially constant current flows between output terminal 504' and power supply source 708 in accordance with the gate potential of NMOS 205 from control terminal 507'.

Next, a third embodiment of the present invention will be described in detail below. A feature of the third embodiment is that a plurality of output buffer circuits are connected to an n-channel constant voltage circuit and a p-channel constant voltage circuit.

Figure 6:
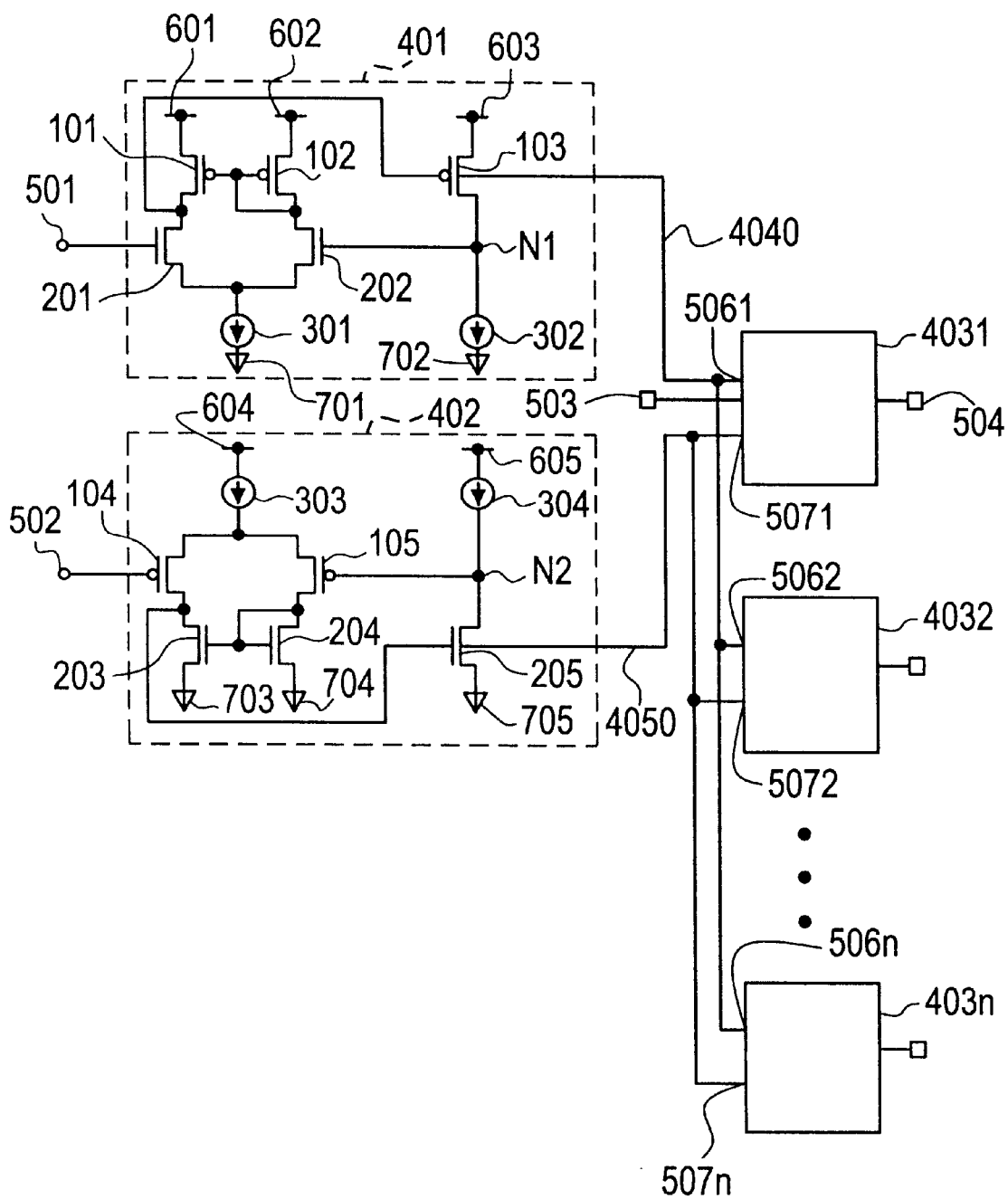
FIG. 6 is a circuit diagram of the output buffer circuit of the third embodiment of the present invention.
Figure 7:
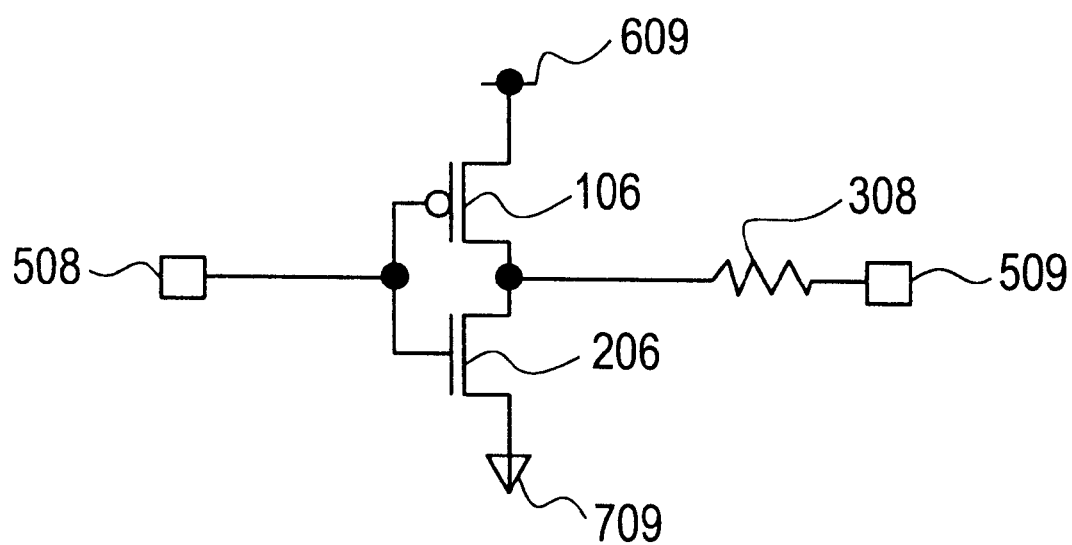
FIG. 7 is a circuit diagram of a conventional output circuit.

Referring to FIG. 6, an output circuit of the third embodiment includes a plurality of output buffer circuits 4031, 4032, . . . , and 403n (n is an integer greater than 1). Output buffer circuits 4031 through 403n have control terminals 5061 through 506n, respectively, and control terminals 5071 through 507n, respectively. A contact 4040 connects the gate terminal of PMOS transistor 103 and control terminals 5061 through 506n. A contact 4050 connects the gate terminal of NMOS transistor 205 and control terminals 5071 through 507n.

In the above embodiments, while output buffer circuits 403 and 403' are formed on a complementary MOS (CMOS) circuit, the present invention may be applied to a open-drain buffer circuit. In this case, for example, an output circuit comprises a p-cannel constant voltage circuit 402, a PMOS transistor 803, and NMOS transistors 901 and 902. Another output circuit in this case includes p-channel constant voltage circuit 402 and NMOS transistors 904 and 905.

While this invention has been described in conjunction with the preferred embodiments above, it will now readily be possible for those skilled in the art to put this invention into practice using various other manners.

What is claimed is:

1. An output circuit comprising:

an output terminal;

a buffer circuit which includes a first circuit having a first input terminal, to which a first input signal is input, connected to a first power supply source, wherein said first circuit forms a first current path between said first power supply source and said output terminal in accordance with said first input signal and a second circuit having a second input terminal, to which a second input signal is input, connected to a second power supply source, wherein said second circuit forms a second current path between said second power supply source and said output terminal in accordance with said second input signal;

a first constant voltage circuit which provides said first input signal to said first input terminal and causes current flowing on said first current path to be constant or substantially constant; and a second constant voltage circuit which provides said second input signal to said second input terminal and causes current flowing on said second current path to be constant or substantially constant.

2. The output circuit as claimed in claim 1, wherein said buffer circuit further comprises a third circuit which is connected between said first and second constant voltage circuits and said first and second circuits and which prevents said first and second constant voltage circuit from providing said first and second input signal to said first and second input terminal, respectively.

3. The output circuit as claimed in claim 1, wherein said first constant voltage circuit includes a first node, which is related to a potential of a point in said first current path, and a first adjust circuit which adjusts the potential of said first node in accordance with the difference between the potential of said node and a first predetermined potential; and wherein said second constant voltage circuit includes a second node, which is related to a potential of a point in said second current path, and a second adjust circuit which adjusts a potential of said second node in accordance with the difference between the potential of said second node and a second predetermined potential.

4. The output circuit as claimed in claim 3, wherein said first and second adjust circuit causes the potential of said first and second nodes to be identical with, or close to, said first and second predetermined potential, respectively.

5. The output circuit as claimed in claim 3, wherein said first and second adjust circuits produce first and second adjust signals which adjust the potentials of said first and second nodes in accordance with the difference between the potentials of said first and second node and said first and second predetermined potentials, respectively;

wherein said first circuit comprises a first transistor connected between said output terminal and said power supply source, wherein said first transistor forms said first current path in accordance with said first adjust signal;

wherein said second circuit comprises a second transistor connected between said output terminal and said second power supply source, wherein said second transistor forms said first current path in accordance with said second adjust signal;

wherein said first constant voltage circuit comprises a third transistor connected to said first node and is controlled by said first adjust signal; and wherein said second constant voltage circuit comprises a fourth transistor connected to said second node and is controlled by said second adjust signal.

6. The output circuit as claimed in claim 3, wherein said first constant voltage circuit comprises a current source connected between said first node and third power supply source.

7. The output circuit as claimed in claim 1, wherein said first circuit includes a first transistor which is connected between said output terminal and said first power supply source; and wherein said second circuit includes a second transistor which is connected between said output terminal and said second power supply source.

8. The output circuit as claimed in claim 7, wherein said first transistor includes a PMOS transistor; and wherein said second transistor includes an NMOS transistor.

9. The output circuit as claimed in claim 1, wherein said first constant voltage circuit includes a third transistor which has a control terminal inputting said first input signal;

wherein said second constant voltage circuit includes a fourth transistor which has a control terminal inputting said second input signal;

wherein said first circuit includes a first transistor which is connected between said output terminal and said first power supply source and has a control terminal inputting said first input signal; and wherein said second circuit includes a second transistor which is connected between said output terminal and said second power supply source and has a control terminal inputting said first input signal.

10. The input circuit as claimed in claim 1, wherein said buffer circuit further comprises a fourth circuit which is connected between said first and second constant voltage circuits and said first and second circuits and which prevents said first and/or second current path from forming.

11. The output circuit as claimed in claim 10, wherein said fourth circuit includes:
- a fifth transistor which is connected between said first input terminal and said first circuit and prevents said first input signal form inputting to said first circuit when said fourth circuit prevents said first current path from forming;
- a sixth transistor which is connected between said a third power supply source and said first circuit and provides the potential based on said third power supply source when said fourth circuit prevents said first current path from forming;
- a seventh transistor which is connected between said second input terminal and said second circuit and prevents said second input signal from inputting to said second circuit when said fourth circuit prevents said second current path from forming; and
- an eighth transistor which is connected between said a fourth power supply source and said second circuit and provides the potential based on said fourth power supply source when said fourth circuit prevents said second current path from forming.

12. The output circuit as claimed in claim 1, wherein said buffer circuit further comprises a fifth circuit which is connected between said first circuit and said output terminal and between said second circuit and said output terminal and which prevents said first and/or second current path from forming.

13. The output circuit as claimed in claim 12, wherein said fifth circuit includes:
- a ninth transistor which is connected between said first circuit and said output circuit; and
- a tenth transistor which is connected between said second circuit and said output circuit.

* * * * *